(12) United States Patent  
Klübenspies

(10) Patent No.: US 6,335,864 B1
(45) Date of Patent: Jan. 1, 2002

(54) INDICATOR MODULE

(75) Inventor: Dieter Klübenspies, Kelkheim (DE)

(73) Assignee: Mannesmann VDO AG, Frankfurt (DE)

( * ) Notice: Subject to any disclaimer, the term of this patent is extended or adjusted under 35 U.S.C. 154(b) by 0 days.

(21) Appl. No.: 09/270,316

(22) Filed: Mar. 16, 1999

(30) Foreign Application Priority Data

Jan. 20, 1999 (DE) ........................................... 199 01 980

(51) Int. Cl.$^7$ ................................................. H05R 7/02
(52) U.S. Cl. .................. 361/760; 361/752; 361/753; 361/730; 439/71; 349/58; 349/60; 362/26; 362/29
(58) Field of Search ................................ 361/760, 761, 361/752, 730, 742; 362/26, 29, 32; 200/310; 349/58–60, 149; 439/71, 73, 331

(56) References Cited

U.S. PATENT DOCUMENTS

| 4,357,061 | A | * | 11/1982 | Crosby ...................... 339/17 C |
| 4,422,728 | A | * | 12/1983 | Andreaggi ................... 360/334 |
| 4,618,915 | A | * | 10/1986 | Bury .......................... 361/400 |
| 4,994,734 | A | * | 2/1991 | Germer et al. .............. 324/142 |
| 5,068,962 | A | * | 12/1991 | Germer et al. ................. 29/830 |
| 5,155,612 | A | * | 10/1992 | Adachi et al. ................. 359/80 |
| 5,373,132 | A | * | 12/1994 | Achermann et al. ........ 200/310 |
| 5,697,689 | A | * | 12/1997 | Levine et al. ................. 362/26 |
| 5,719,434 | A | * | 2/1998 | Levine et al. ............... 257/666 |

FOREIGN PATENT DOCUMENTS

| DE | 9418791 | 2/1995 |
| DE | 19747288 | 4/1999 |

OTHER PUBLICATIONS

Patent Abstracts of Japan 01222291 A Sep. 5, 1989.
Patent Abstracts of Japan 08262988 A Oct. 11, 1996.

* cited by examiner

Primary Examiner—Jeffrey Gaffin
Assistant Examiner—Tuan Dinh
(74) Attorney, Agent, or Firm—Martin A. Farber

(57) ABSTRACT

An indicator module, suitable for a vehicle, has a holder engaging over an indicator element for fastening the indicator element to a carrier board such as a printed circuit board. The holder is connected by one leg to the carrier board by a catching of the leg into a recess of the carrier board. The recess of the carrier board has a projecting tongue, and the leg of the holder has a recess engaging over the tongue to accomplish a simplified mounting which retains the indicator element upon the carrier board.

16 Claims, 3 Drawing Sheets

INDICATOR MODULE

FIELD AND BACKGROUND OF THE INVENTION

The invention relates to an indicator module, in particular for a vehicle, with a holder engaging over an indicator element and fastening the latter to a carrier board, the holder being connected by means of one leg to the carrier board by catching into a recess of the latter.

Indicator modules of this type are known, an indicator element being fastened to a carrier board, designed as a printed circuit board, in that a plurality of legs with tabs are integrally formed on the holder, thus making joggled joints with the printed circuit board possible. Joggled joints of this kind make it necessary to carry out additional fastening operations which can be mechanized only at considerable outlay.

It was therefore proposed, in DE 94 18 791 U1, to design the holder in such a way that it can be mounted by being plugged onto the printed circuit board, and the holder and consequently the indicator module are fastened automatically by snap-connection means cooperating with the printed circuit board, the solution described in the utility model mentioned being effective along the lines of a joggled joint. In this case, when the holder is being mounted, legs formed on the holder are introduced into slots made in the printed circuit board and arranged at an angle to the transverse extent of the legs. During this assembly operation, the legs experience torsion about their longitudinal axis and pivot backward when an end position is reached. If a cost-effective and easily stampable and bendable sheet metal material is used for the holder, however, the springiness and consequently the pivot angle of the legs are low, so that engagement behind the printed circuit board is achieved with scarcely any reliability. Moreover, a considerable amount of force is required in order to fasten the holder, since the forces for twisting the legs when they begin to penetrate into the corresponding slots in the printed circuit board are introduced on an extremely short lever arm. This results in deformation of the slots in the printed circuit board and/or a removal of material and even a reduction in the springiness and therefore the pivot angle of the legs, thus reducing the reliability of the fastening in an undesirable way.

SUMMARY OF THE INVENTION

In order to remedy this, the object of the present invention is to provide an indicator module of the type initially mentioned which allows an indicator element to be mounted on a carrier board with little force and in a way suitable for large series production, the holder assigned to the indicator module being capable of being produced at little outlay and of being connected to the carrier board unmistakably and reliably.

This object is achieved, according to the invention, in that the recess of the carrier board has a projecting tongue and the leg of the holder has a recess engaging over the tongue and retaining the indicator element on the carrier board.

In contrast to the known indicator modules, the invention ensures both that the holder is inserted into the carrier board with little force and that the indicator element is positioned reliably and unmistakably in relation to the carrier board by virtue of the simultaneous catching of the leg of the holder into the carrier plate and engagement over the tongue. There is no torsion of the leg, requiring a large amount of force, during assembly. Particularly when the indicator module is used in indicator units, such as, for example, instrument clusters of automobiles, which are produced in very large series and are exposed to persistent vibratory stress while the vehicles are in operation, the simple mountability and high durability of the indicator module according to the invention are particularly advantageous. Moreover, there is no need to use a high-quality torsion-resistant material for the holder, so that the invention results in considerably lower material costs, as compared with the know indicator modules.

It could be imagined that the leg of the holder merely clamps the latter into the carrier board, the tongue of the recess of the carrier board preventing the holder from creeping out. However, the indicator element is fixed particularly accurately in position and securely when, according to an advantageous development of the invention, an edge of the recess of the leg, said edge facing away from the indicator element, bears on the rear side of the tongue, said rear side facing away from the indicator element.

The assembly of the indicator module is already simplified due to the fact that the elasticity of the entire holder can be utilized for deflecting the leg in order to engage over the tongue. Even easier mounting and particularly secure retention of the indicator element on the carrier board are obtained preferably when the leg is resiliently elastic approximately in the direction of extent of the tongue.

The holder could, for example, be a plastic component. By contrast, according to an advantageous development of the invention, the holder is, in a particularly cost-effective way, a bent and/or canted metal sheet, and a simple strip steel may be used for this purpose.

Prevention of tilting of the holder in relation to the carrier board and positionally accurate arrangement of the holder, and therefore of the indicator element, on the carrier board are advantageously ensured, even over a long operating period of the indicator module and under high vibratory stress on the latter, when the holder has at least two legs which are arranged on opposite sides of the indicator element, in each case engaging over a tongue of a recess of the carrier board and retaining the indicator element on the carrier board.

It is also particularly advantageous if the leg is arranged approximately perpendicularly to the carrier board, so that the indicator module can be assembled approximately in the axial direction, that is to say approximately perpendicularly to the carrier board, in a simple and easily automatable way.

If, according to another advantageous development of the invention, the carrier board is a printed circuit board electrically contacting the indicator element, reliable electric contacting of the indicator element can take place, without additional electric connection means, solely by means of the clamping force exerted by the holder on the indicator element in relation to the printed circuit board.

The spring rigidity of the leg may advantageously be increased and the durability of the connection of the holder and carrier board improved even further if the leg has preferably a bead running approximately in its longitudinal direction.

Should additional joggling of the leg in relation to the carrier board be desired, for example for reasons of compatibility with older indicator modules, it is particularly advantageous if the leg has, on its end face facing away from the indicator element, a slot connected to the recess of said leg and separating the end face. In this case, by means of the slot, which is only narrow, simple joggling of the two leg tabs located next to one another and formed by the slot is possible, for example by bending round by means of a wedge or ram butting onto the leg tabs transversely to the direction of extent of the latter.

The assembly of the holder is simplified considerably if, according to another advantageous development of the invention, the leg has, on the end face, an angled portion pointing outward away from the indicator element. In this way, both the positioning of the holder in relation to the carrier board during the mounting operation becomes easier and the necessary assembly force is reduced because the angled portion slides on the tongue of the recess of the carrier board so as to prevent the leg end from tilting.

A position of the holder on the carrier board which is reliable in the direction of all the planes of the carrier board and easy insertion of the holder are advantageously achieved when, in order to free the tongue in the carrier board, the recess of the carrier board is U-shaped, the length of the base side of the recess being larger than the width of that leg of the holder which is assigned to the tongue.

The indicator element could be fastened directly to the carrier board by means of the holder. Particularly when the indicator element is used together with other instruments in an indicator unit, however, it is particularly favorable if a carrier supporting the indicator element on the carrier board is arranged between the indicator element and carrier board. In this case, with the aid of the carrier, the height of the indicator element in relation to the carrier board can be set in a desired way (in particular, so as to be adapted to other indicators).

According to a particularly advantageous development of the invention, the carrier has a laterally projecting extension matching the tongue of the recess of the carrier board. The extension, which matches the tongue of the carrier board and therefore also the leg of the holder, serves for deflecting the leg transversely to the direction of its extent when the holder is pushed onto the carrier provided with the indicator element. As a result of this deflection, the leg is guided directionally over the tongue of the recess of the carrier board in a particularly simple way.

It is also particularly advantageous if the recess of the leg of the holder engages over the extension of the carrier. The full spring tension force of the leg in relation to the tongue of the carrier board is thereby maintained. In addition, therefore, the extension and the tongue can be braced one against the other.

According to an advantageous development of the invention, the leg is guided over the extension of the carrier particularly easily and finds the recess of the carrier board in a predetermined and reliable way if the extension of the carrier widens in a wedgelike manner toward the carrier board.

It is particularly advantageous, at the same time, if the wedgelike extension forms a ramp which merges into a foot corresponding approximately to the width of the matching tongue and standing up on the carrier board, thereby additionally ensuring a secure stance of the carrier on the carrier board and play-free positioning of the components.

If a plurality of legs are provided on the holder, it would be conceivable for only some (for example, two opposite ones) of these legs to be guided on the carrier with the aid of extensions. By contrast, the guidance and positioning of the holder are particularly good if, according to an advantageous development of the invention, the carrier has a number of extensions corresponding to the number of legs of the holder and of the associated recesses of the carrier board.

BRIEF DESCRIPTION OF THE DRAWINGS

The invention may be embodied in widely differing ways. It is explained in more detail below with reference to exemplary embodiments illustrated in the accompanying drawings, in which.

DETAILED DESCRIPTION OF THE PREFERRED EMBODIMENTS

Figure 1:
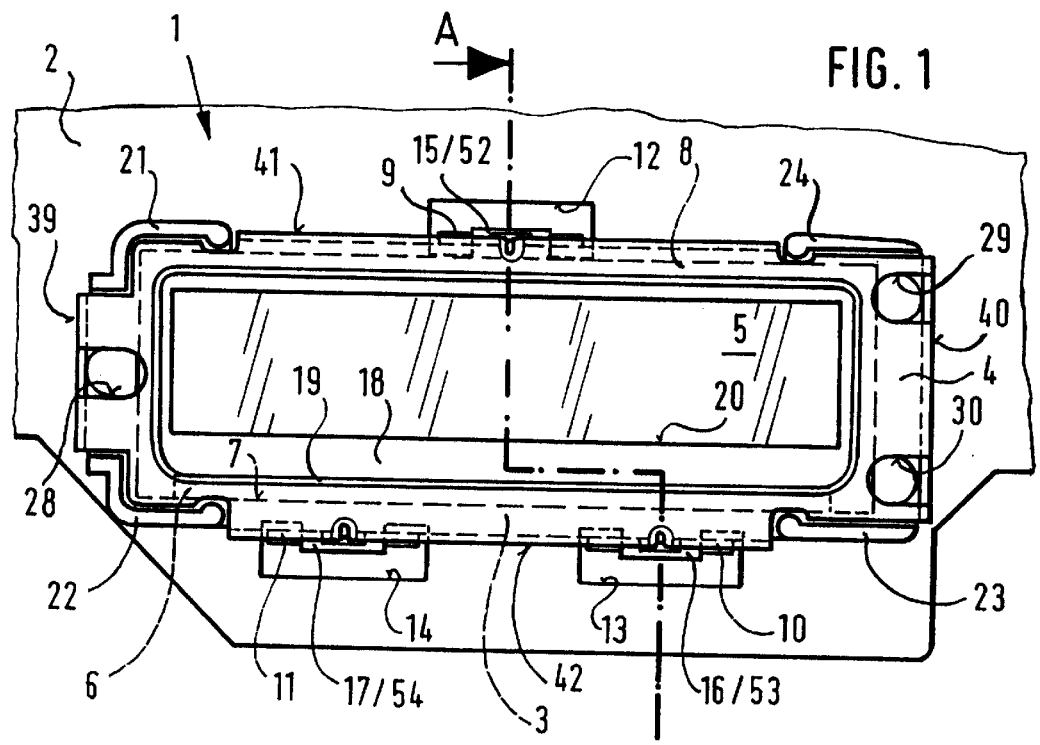
FIG. 1 shows a top view of an indicator module fastened to a printed circuit board.

FIG. 1 illustrates an indicator module 1 which is fastened to a printed circuit board 2 and which, for example in an instrument cluster in an instrument panel of an automobile, serves for the selectable display of the trip counter mileage, the total mileage of the respective vehicle, the fuel consumption and such like measurement quantities or calculated data. In this case, a carrier 3 (see FIG. 2) is surrounded by a holder 4, which is interlocked with the printed circuit board 2 in a way yet to be described in more detail, and is retained on the printed circuit board 2. The carrier 3 supports an indicator element 5 (for example, an LC display) which, when the holder 4 is mounted on the printed circuit board 2, is connected electrically, by means of a conductive rubber strip 6 arranged in a slot 7 of the carrier 3, to contacts formed on the printed circuit board 2. The conductive rubber strip 6 at the same time causes the indicator element 5 to be pressed resiliently onto the holder 4. Thus, cooperation with a two-armed flexion bar 8 integrally formed on that side of the carrier 3 which is located opposite the slot 7, said conductive rubber strip constitutes a spring element. In this case, the carrier 3 is designed in such a way that there is sufficient excess stroke for the locking or snapping effect of three legs 9, 10, 11 of the holder 4 on the printed circuit board 2.

Figure 2:
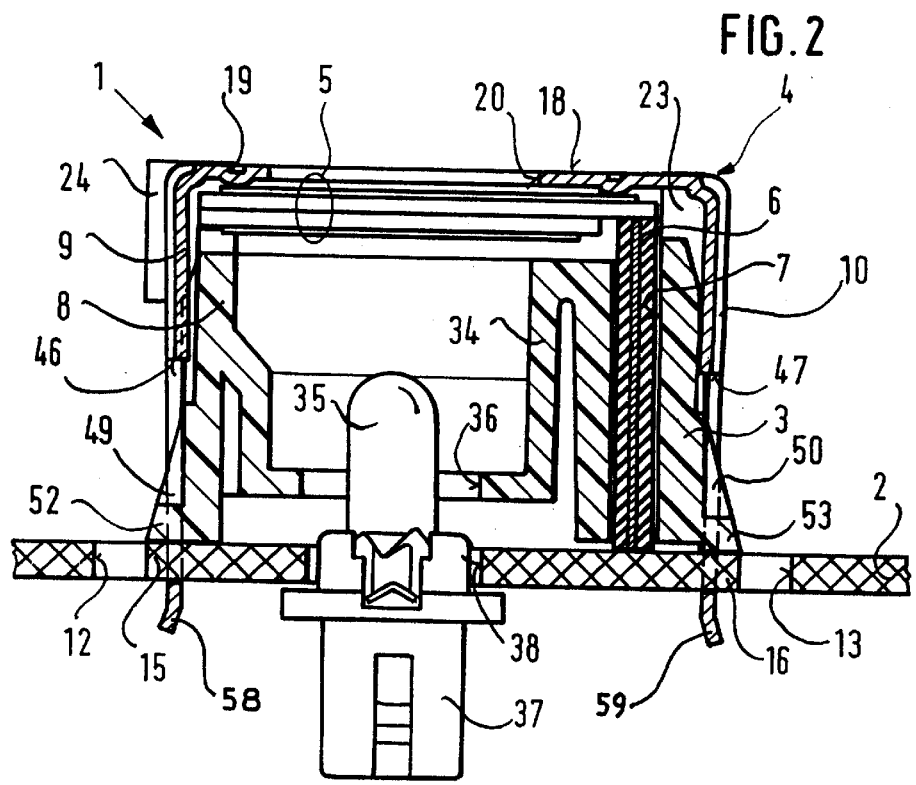
FIG. 2 shows a section through the indicator module along the sectional line A in FIG. 1.
Figure 8:
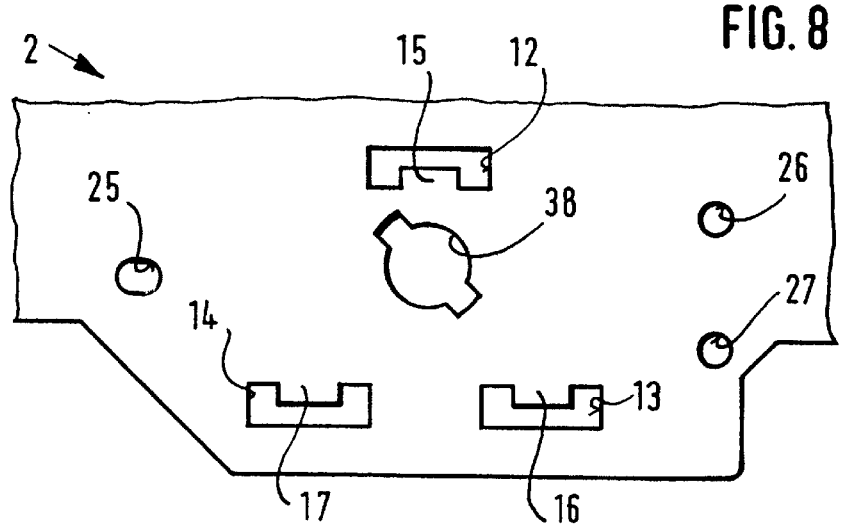
FIG. 8 shows an illustration of that region of the printed circuit board in which the indicator module is fastened.

In the snapped-in state, as shown in FIGS. 1 and 2, the legs 9, 10, 11 engage through U-shaped recesses 12, 13, 14 matching them and located in the printed circuit board 2 (see also FIG. 8) and engage over tongues 15, 16, 17 projecting in the plane of the printed circuit board 2 in these recesses. The indicator element 5 is pressed by the flexion bar 8 and the conductive rubber strip 6 against a bead 19 formed peripherally in a front frame 18 of the holder 4 and is thereby elastically retained and contacted. A window cutout 20 provided in the front frame 18 leaves free an indicator field of the indicator element 5. Contours 21, 22, 23, 24 constitute jaws which are integrally formed on the carrier 3 and which serve for retaining the indicator element 5 transversely to the longitudinal axis of the indicator module 1. The orientation of the components of the indicator module 1 in the direction of the longitudinal axis, in particular of the contacts on the printed circuit board 2, and the assurance of fault-free engagement of the snap-connection means are carried out, when the indicator module 1 is being mounted, by means of a device which engages with aligning pins into orifices 25, 26, 27 in the printed circuit board 2. The aligning pins are assigned orifices 28, 29, 30 in the holder 4 and clearances 31, 32, 33 in the carrier 3.

Figure 6:
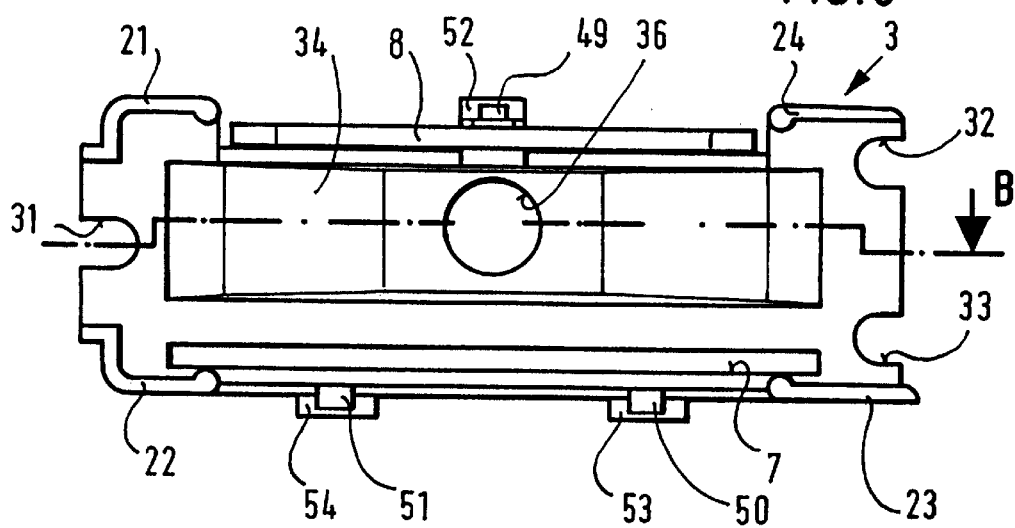
FIG. 6 shows a top view of the carrier provided in the indicator module.
Figure 7:
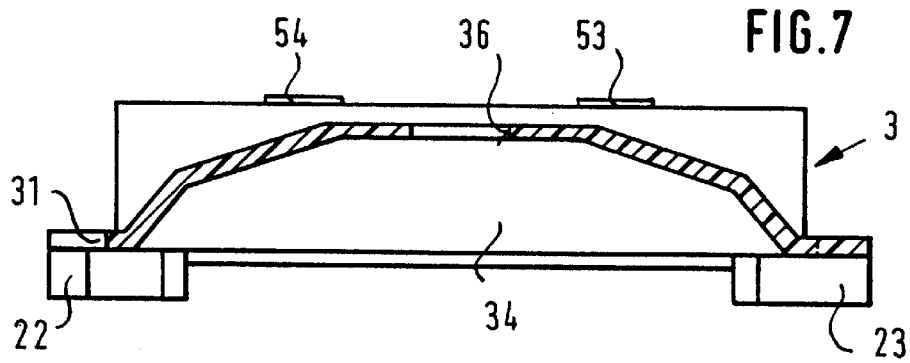
FIG. 7 shows a section through the carrier along the sectional line B in FIG. 6.

A light box 34 is formed on the carrier 3 of the indicator module 1 (see also FIGS. 6 and 7) and serves, in cooperating with a lamp 35, for transilluminating indicator elements 5. The lamp 35, which engages through a recess 36 into the light box 34, is fastened and contacted by means of a cap 37 on the printed circuit board 2, in which an orifice 38 is made for this purpose.

Figure 3:
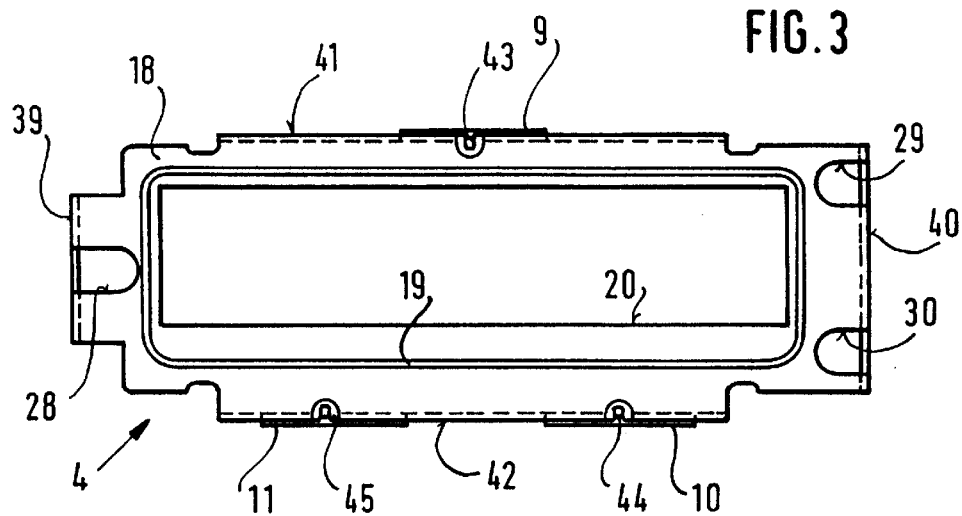
FIG. 3 shows a top view of a holder of the indicator module.
Figure 4:
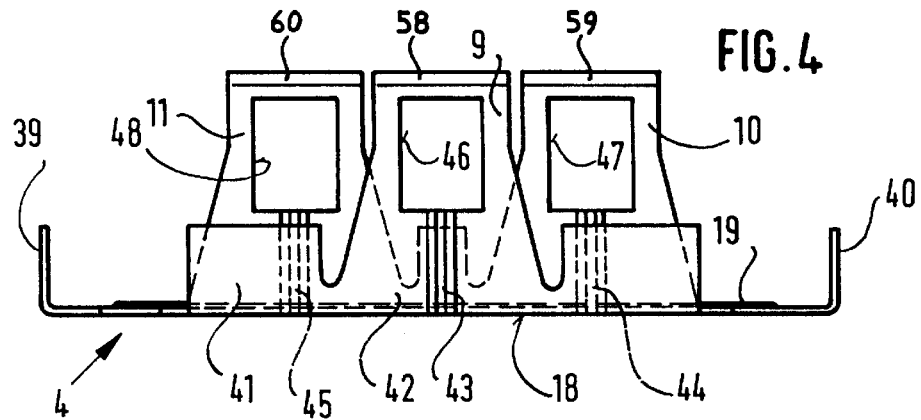
FIG. 4 shows a side view of the holder according to FIG. 3.

As is evident from FIGS. 3 and 4, wall elements 39, 40, 41, 42 are integrally formed, at right angles to the front frame 18, on the holder 4 produced as a stamped/bent part from sheet metal, longitudinal wall elements 41, 42 located opposite one another merging into the legs 9, 10, 11. The first leg 9 is formed on the first longitudinal wall element 41 of the holded 4 and the other two legs 10, 11 are formed on the opposite longitudinal wall element 42. The asymmetric distribution of the legs ensures that the holder 4, when being mounted, is inserted into the printed circuit board 2 in the correct position (mounting coding). The wall elements serve as a socket for the carrier 3. At the same time, the wall elements 41, 42 are designed, in terms of their length, in such a way that they do not bring about complete stiffening of the holder 4, but allow some elastic deformation, even of the front frame 18, in order thereby to achieve as long as lever arm as possible for the deflection of the legs 9, 10, 11 which is necessary for the snapping function, so that, even if the sheet metal material has low springiness, the desired snapping function is possible. This purpose is also served by beads 43, 44, 45 provided for stiffening the legs 9, 10, 11.

The legs 9, 10, 11 have recesses 46, 47, 48 engaging over the tongues 15, 16, 17 and retaining the indicator element 5 on the printed circuit board 2, in each case an edge of the recesses 46, 47, 48, said edge facing away from the indicator element 5, bearing on the rear side of the tongues 15, 16, 17 which faces away from the indicator element 5. The legs 9, 10, 11 are provided, on the end face, with angled portions 58, 59, 60, in order to achieve a sliding block action in respect of lateral extension having wedgelike contours, said extensions being formed on the carrier 3 and serving for deflecting the legs 9, 10, 11. The extensions each consist of a ramp 49, 50, 51 and of a foot 52, 53, 54 which corresponds essentially to the width of the respective tongue 15, 16, 17.

The dimension between the end faces of the tongues 15, 16, 17 is larger than the mutual spacing of the legs 9, 10, 11 in the relaxed state and the end-face dimension between the feet 52, 53, 54 corresponds essentially to that of the tongues 15, 16, 17. Expediently, the feet 52, 53, 54 integrally formed on the carrier 3 are designed in such a way that, as is not designated in any more detail, the standing surfaces of the carrier 3 on the printed circuit board 2 are formed on them and a stable 3-point support of the indicator module 1 is therefore provided. The orifices 46, 47, 48 cut free in the legs 9, 10, 11 of the holder 4 are designed for the passage of the tongues 15, 16, 17, of the feet 52, 53, 54 and of the ramps 49, 50, 51.

Figure 5:
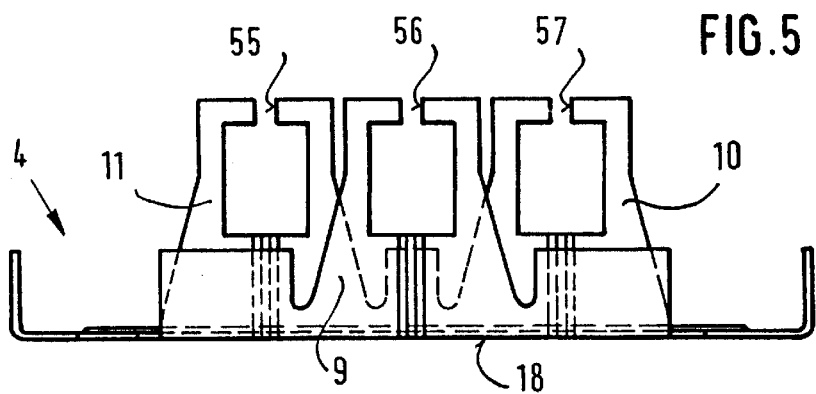
FIG. 5 shows a side view of a holder with slotted legs.

The embodiment, shown in FIG. 5, in which the legs 9, 10, 11 of the holder 4 are in each case provided, on the end face, with slot 55, 56, 57, allows additional joggling of the leg tabs obtained as a result of the slotting. In this case, by means of the slot, which is only narrow, simple jogging of the two leg tabs located next to one another is possible, for example by bending round by means of a wedge or ram butted onto the leg tabs transversely to the direction of extent of the latter.

I claim:

1. An indicator module, in particular for a vehicle, comprising a holder engaging over an indicator element and fastening the indicator element to a carried board, a carrier (3) supporting the indicator element (5) on the carrier board arranged between the indicator element (5) and the carrier board, the holder being connected by means of one leg to the carrier board by catching into a recess of the carrier board, wherein said recess (12; 13; 14) of the carrier board (printed circuit board 2) has a projecting tongue (15; 16; 17), and a let (9; 10; 11) of the holder (4) has a recess (46; 47; 48) engaging over the tongue (15; 16; 17) and retaining the indicator element (5) on the carrier board (printed circuit board 2), and wherein the carrier has an extension projecting toward the tongue and terminating in a foot corresponding approximately to the width of the matching tongue and standing on the carrier board.

2. The indicator module as claimed in claim 1, wherein an edge of the recess of the leg, said edge facing away from the indicator element, bears on a side of the tongue facing away from the indicator element.

3. The indicator module as claimed as claim 1, wherein the leg of the holder is resiliently elastic approximately in a direction parallel to the tongue.

4. The indicator module as claimed in claim 1, wherein a portion of the holder is configured as a bent and/or canted metal sheet for engagement with the indicator.

5. The indicator module as claimed in claim 1, wherein the holder (4) has at least two legs (9; 10; 11) which are arranged on opposite sides of the indicator element (5), in each case engaging over a tongue (15; 16; 17) of a recess (12; 13; 14) of the carrier board (printed circuit board 2) and retaining the indicator element (5) on the carrier board (printed circuit board 2).

6. The indicator module as claimed in claim 1, wherein the leg (9; 10; 11) is arranged approximately perpendicular to the carrier board (printed circuit board 2).

7. The indicator module as claimed in claim 1, wherein the carrier board is a printed circuit board (2) electrically contacting the indicator element (5).

8. The indicator module as claimed in claim 1, wherein the leg (9; 10; 11) has a bead (43; 44; 45) running approximately in its longitudinal direction.

9. The indicator module as claimed in claim 1, wherein the leg (9; 10; 11) has, on its end face facing away from the indicator element (5), a slot (55; 56; 57) connected to the recess of said leg and separating the end face.

10. The indicator module as claimed in claim 1, wherein the leg (9; 10; 11) has, on the end face, an angled portion (58; 59; 60) pointing outward away from the indicator element (5).

11. The indicator module as claimed in claim 1, wherein, in order to free the tongue (15; 16; 17) in the carrier board (printed circuit board 2), the recess (12; 13; 14) of the carrier board is U-shaped, the length of the base side of the recess (12; 13; 14) being larger than the width of that leg (9; 10; 11) of the holder (4) which is associated to the tongue.

12. The indicator module as claimed in claim 1, wherein the extension of the carrier (3) matches the tongue (15; 16; 17) of the recess (12; 13; 14) of the carrier board (printed circuit board 2).

13. The indicator module as claimed in claim 12, wherein the recess (46; 47; 48) of the leg (9; 10; 11) of the holder (4) engages on the extension of the carrier (3).

14. The indicator module as claimed in claim 12, wherein the extension of the carrier (3) widens in a wedge-like manner toward the carrier board (printed circuit board 2).

15. An indicator module, in particular for a vehicle, comprising a holder engaging over an indicator element and fastening the indicator element to a carrier board, the holder being connected by means of one leg to the carrier board by catching into a recess of the carrier board, wherein said recess (12; 13; 14) of the carrier board (printed circuit board 2) has a projecting tongue (15; 16; 17), and a leg (9; 10; 11) of the holder (4) has a recess (46; 47; 48) engaging over the tongue (15; 16; 17) and retaining the indicator element (5) on the carrier board;

wherein a carrier (3) supporting the indicator element (5) on the carrier board is arranged between the indicator element (5) and the carrier board;

the carrier has a laterally projecting extension matching the tongue of the recess of the carrier board;

the extension of the carrier widened in a wedge-like manner toward the carrier board; and the wedge-like extension forms a ramp (49; 50; 51) which merges into a foot (52; 53; 54) corresponding approximately to the width of the matching tongue (15; 16; 17) and standing up on the carrier board (printed circuit board 2).

16. The indicator module as claimed in claim 12, wherein the carrier (3) has a number of extensions corresponding to the number of legs (9; 10; 11) of the holder (4) and of the associated recesses (12,; 13; 14) of the carrier board (printed circuit board 2).

\* \* \* \* \*